United States Patent [19]

Zeidler et al.

[11] 4,355,368
[45] Oct. 19, 1982

[54] ADAPTIVE CORRELATOR

[75] Inventors: James R. Zeidler, San Diego; John M. McCool, El Cajon; Bernard Widrow, Stanford, all of Calif.

[73] Assignee: The United States of America as represented by the Secretary of the Navy, Washington, D.C.

[21] Appl. No.: 194,168

[22] Filed: Oct. 6, 1980

[51] Int. Cl.³ ............................................. G06F 15/336
[52] U.S. Cl. ...................................... 364/728; 364/724
[58] Field of Search ......................... 364/728, 724, 819

[56] References Cited

U.S. PATENT DOCUMENTS

| | | | |
|---|---|---|---|
| 4,006,351 | 2/1977 | Constant | 364/724 |
| 4,038,539 | 7/1977 | Van Cleave | 364/724 |
| 4,207,624 | 6/1980 | Dentino et al. | 364/724 X |
| 4,283,767 | 8/1981 | Rountree | 364/728 X |

OTHER PUBLICATIONS

Morgan et al., "Real-Time Adaptive Linear Prediction using the Least Mean Square Gradient Algorithm", *IEEE Trans. on Acoustics, Speech & Signal Processing,* Dec. 1976, pp. 494–507.
Burdic, "Detection of Narrowband Signals using Time-Domain Adaptive Filters", *IEEE Trans. on Aerospace and Electronic Systems,* Jul. 1978, pp. 578–591.
Dentino et al., "Adaptive Filtering in the Frequency Domain", *Proceedings of the IEEE,* Dec. 1978, pp. 1658–1659.
Thompson, "A Constrained Recursive Adaptive Filter for Enhancement of Narrowband Signals in White Noise", *Conference Record of the Twelfth Asilomar Conference on Circuits, Systems and Computers,* Pacific Grove, Ca., pp. 214–218, Nov. 1978.

*Primary Examiner*—David H. Malzahn
*Attorney, Agent, or Firm*—Robert F. Beers; Ervin F. Johnston; John Stan

[57] ABSTRACT

A correlator which is capable of correlating two or more signals of unknown frequency and bandwidth receives inputs on each of two or more channels. For the case of a two-channel, or pairwise, correlator the two channels are designated a first channel and a second channel. For the pairwise correlator, a first adaptive linear predictive (ALP) filter filters the input signal from the first channel and a second ALP filter filters the input signal from the second channel, the two output signals of the filters being $x(k)$ and $y(k)$. The adaptive linear predictive filter is an adaptive time-domain digital filter which adapts its impulse response according to a certain algorithm. The filter output represents an adaptive linear predictive estimate of the current input value, based on many past inputs. The input signals to the two channels of the pairwise correlator may correspond to sensor outputs from two or more widely separated sensors. The two output signals $x(k)$ and $y(k)$, are correlated in a pairwise correlator to result in a signal which corresponds to an estimate of the magnitude-squared coherence between the signal $x(k)$ and a time-delayed, frequency-shifted, version of the signal $y(k)$.

3 Claims, 6 Drawing Figures

BASIC ADAPTIVE CORRELATOR

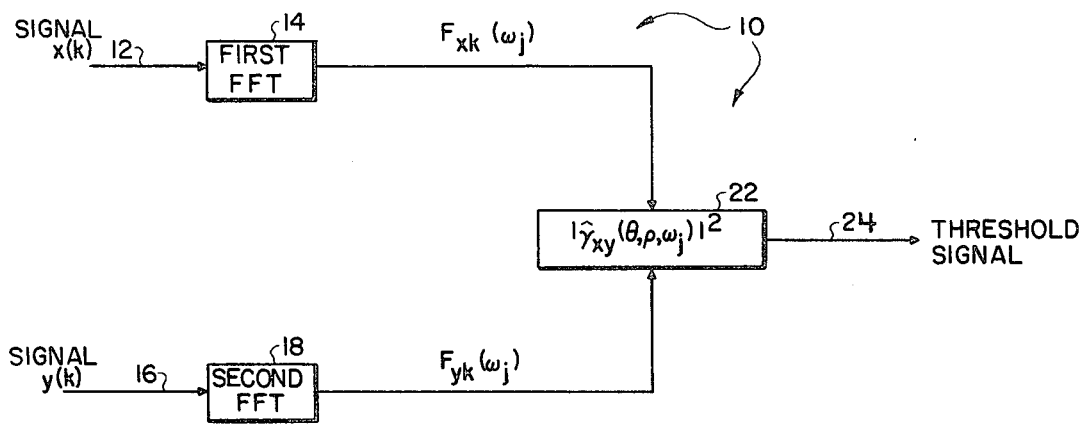
FIG. 1 BASIC IMPLEMENTATION OF THE PAIRWISE MAGNITUDE-SQUARED COHERENCE ALGORITHM
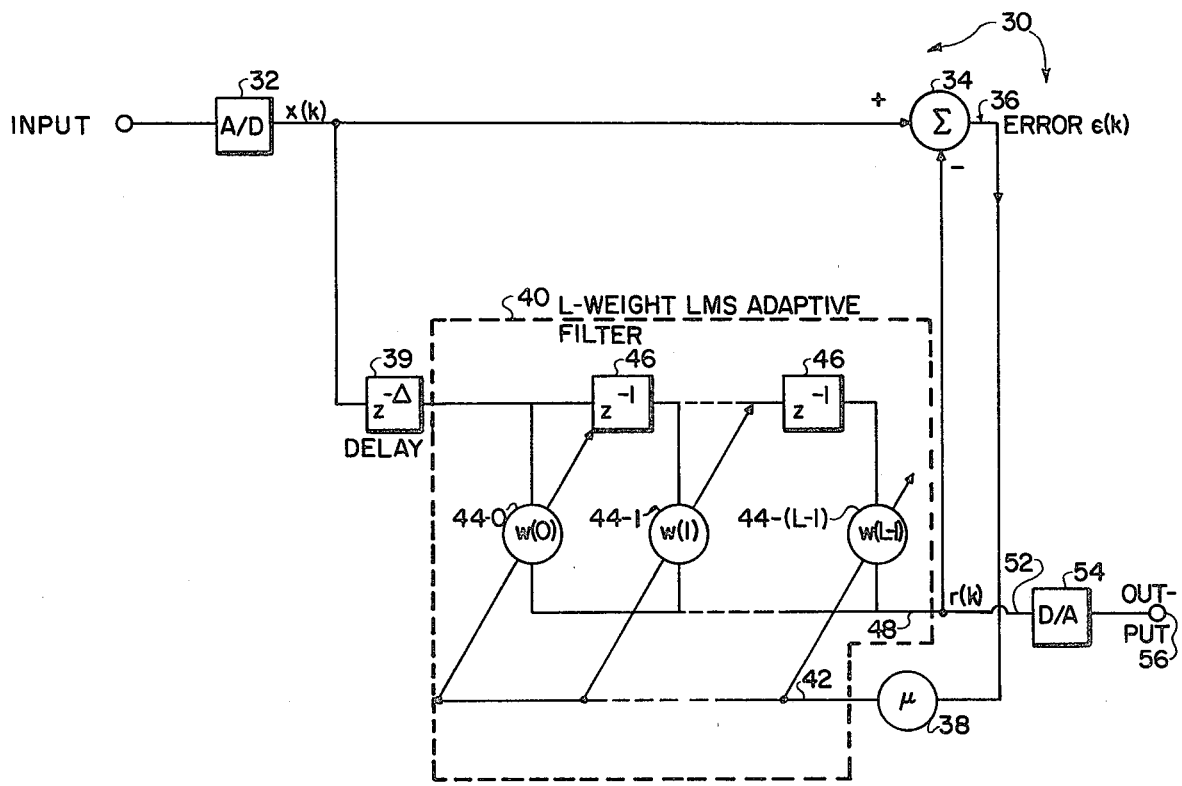
FIG. 2 TIME-DOMAIN ADAPTIVE LINE ENHANCER (ALE)

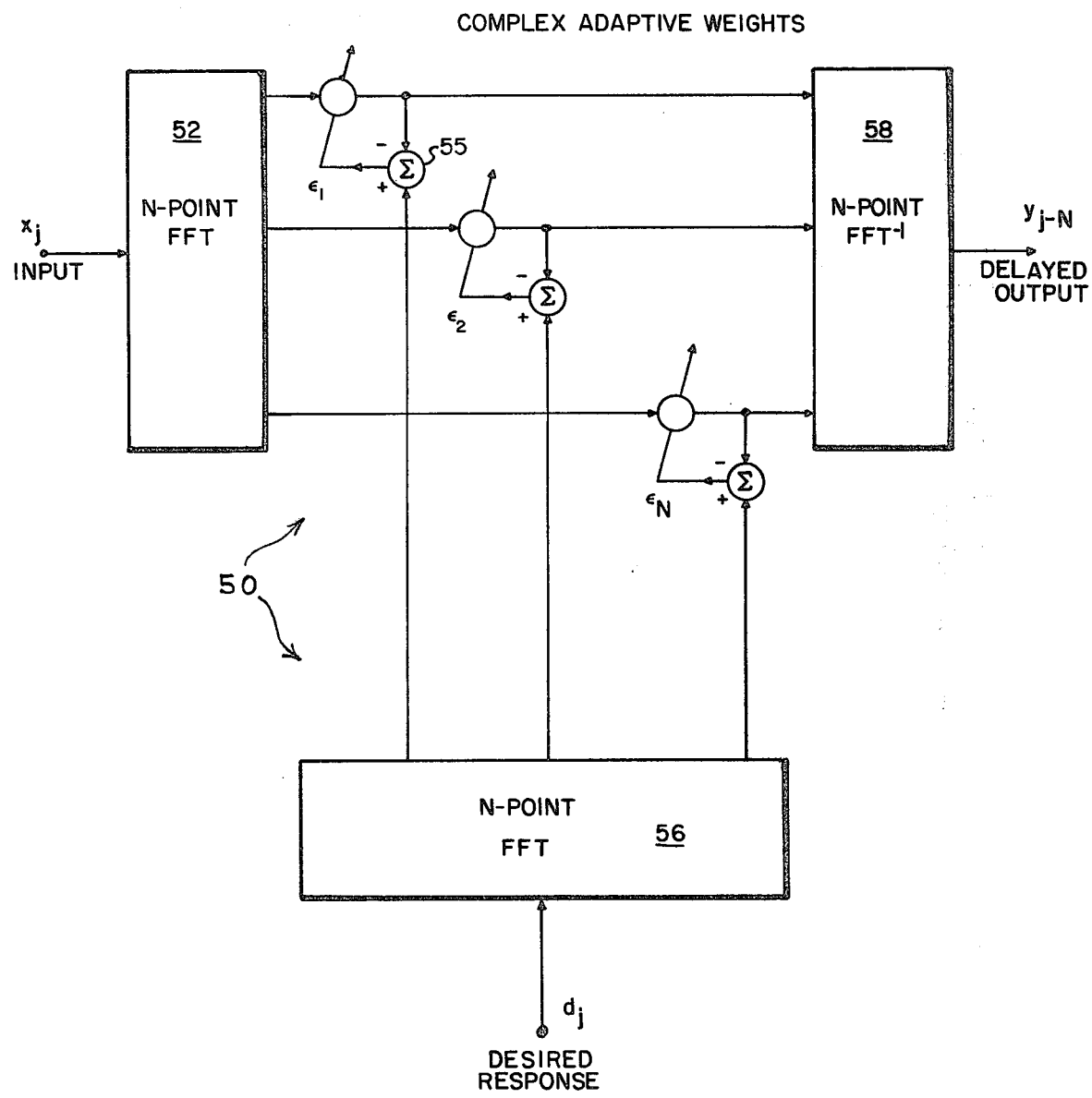
FIG. 3   FREQUENCY-DOMAIN ALE

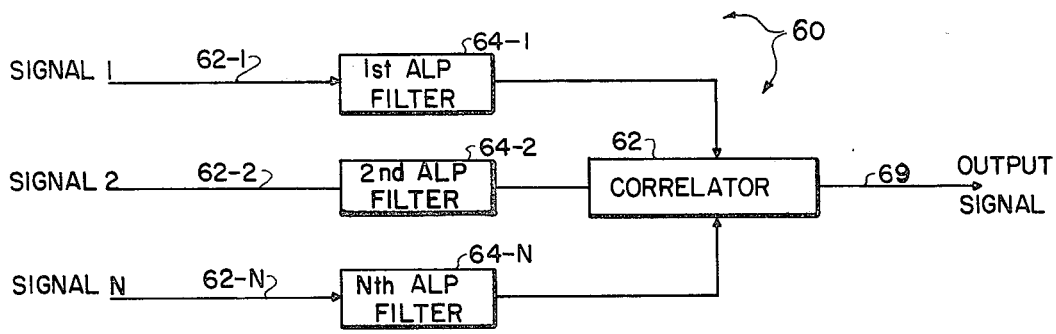
*FIG.4*   BASIC ADAPTIVE CORRELATOR
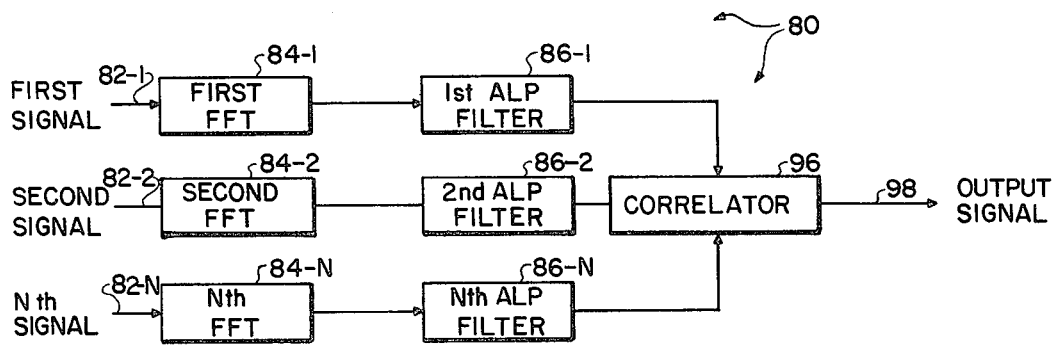
*FIG.5*   SECOND EMBODIMENT OF ADAPTIVE CORRELATOR
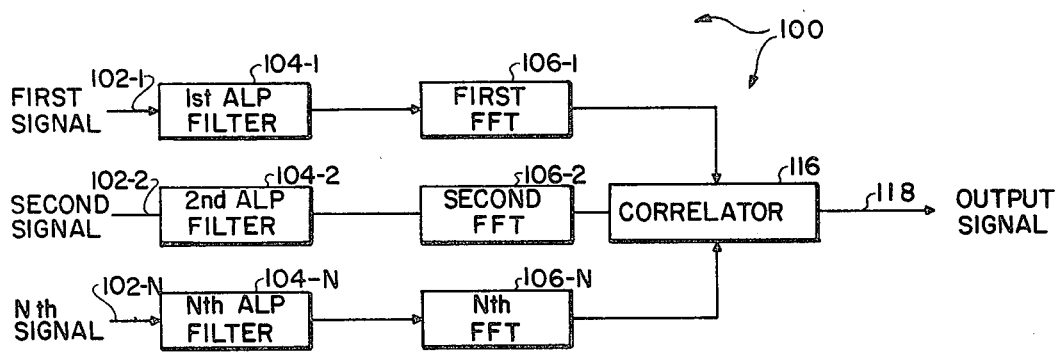
*FIG.6*   THIRD EMBODIMENT OF ADAPTIVE CORRELATOR

4,355,368

ADAPTIVE CORRELATOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The basic feature of all coherent processing techniques is the computation of a frequency domain statistic which represents an estimate of magnitude-squared coherence $|\gamma(\omega)|^2$ between two or more time series. If a common narrowband component with center frequency $\omega_c$ is present in each time series, with the remaining energy in each series uncorrelated, then the true coherence will be nonzero only for frequencies around $\omega_c$. Values of the coherence statistic at discrete frequencies $\omega_j$ (j=0, 1, ..., K-1) are computed over the frequency range of interest and then values above threshold are taken to determine detections. Each time series is derived from the output of a distinct sensor or array of sensors and the various sensor outputs provide the input signals to a multi-sensor or multi-array correlator.

It has been shown that the detection performance for the stationary Gauss-Gauss and fixed processing parameters depends solely on the signal-to-noise ratio (SNR) of the narrowband component in each time series. By optimum matching of the processing bandwidth to the signal bandwidth, these SNRs are maximized. However, for reasons including both data nonstationarities and computational burdens, the processing bandwidth used in coherent multi-sensor correlation processing is generally larger than the anticipated signal bandwidth. This raises the interesting possibility of adaptively pre-filtering the inputs to the multi-sensor coherence processor to enhance the SNRs of all narrowband components contained therein, thus recouping some of the loss due to bandwidth mismatches. It will be shown herein that such an approach is feasible. Specifically, it will be shown that a special type adaptive linear predictive (ALP) filter, namely an adaptive line enhancer (ALE), substantially increases the useful signal output. The adaptive line enhancer is described by J. R. Zeidler and D. M. Chabries, "An Analysis of the LMS Adaptive Filter Used as a Spectral Line Enhancer", report Number NUC TP556, which was published in February 1975 by the Naval Undersea Center, San Diego, Calif., 92152.

SUMMARY OF THE INVENTION

A correlator correlates its two or more input signals. In the case of a pairwise correlator, these signals are denoted as a first and a second signal, each traversing its own channel, a first channel and a second channel.

The correlator comprises an adaptive linear prediction (ALP) filter for recovering input signals on each channel of the correlator and adaptively filtering them. For the case of a pairwise, (two-sensor) correlator, the correlator comprises first and second adaptive linear predictive (ALP) filters, for receiving input signals in their respective channels and adaptively filtering them. A pairwise correlator, whose two inputs are connected to the outputs of the adaptive filter, correlates its input signals.

The adaptive correlator may further comprise fast Fourier transform (FFT) devices in each channel, for receiving and transforming their input signals to that channel. The FFT devices may be located either between the input signals and the ALP filter in each channel, or between the ALP filter and the correlator in each channel.

OBJECTS OF THE INVENTION

An object of the invention is to provide an adaptive correlator suitable for coherent processing of signals received by widely separated sensors.

Another object of the invention is to provide a correlator which is capable of correlating two or more signals of unknown frequency and unknown bandwidth.

Yet another object of the invention is to provide an adaptive correlator which produces a useful output signal even when the correlator bandwidth is significantly larger than the anticipated signal bandwidth.

These and other objects of the invention will become more readily apparent from the ensuing specification when taken together with the drawings.

BRIEF DESCRIPTION OF THE DRAWINGS

FIG. 1 is a block diagram of a basic implementation of the Pairwise Magnitude-Squared Coherence algorithm.

FIG. 2 is a block diagram of a time domain adaptive line enhancer, a specialized type of adaptive linear predictive (ALP) filter.

FIG. 3 is a block diagram of a frequency-domain adaptive line enhancer, another type of ALP filter.

FIG. 4 is a block diagram of the basic adaptive correlator of this invention.

FIG. 5 is a second embodiment of the adaptive correlator of this invention, using the FFT devices shown in FIG. 1 in series with the frequency domain (FD) ALP filters shown in FIG. 3.

FIG. 6 is a third embodiment of the adaptive correlator of this invention, using the same components as those shown in FIG. 5 but connected in a different manner.

DESCRIPTION OF THE PREFERRED EMBODIMENTS

A commonly-used frequency domain measure of correlation between two time series x(k) and y(k) is the pairwise coherence function $\gamma_{xy}(\omega)$ defined by $$\gamma_{xy}(\omega) = \frac{S_{xy}(\omega)}{\sqrt{S_x(\omega)S_y(\omega)}}, \quad -\pi \leq \omega \leq \pi, \quad (1)$$

where $S_{xy}(\omega)$, $S_x(\omega)$ are the respective cross and autospectral densities of x(k) and y(k). The squared-magnitude of this (complex) function is of particular interest.

$$|\gamma_{xy}(\omega)|^2 = \frac{|S_{xy}(\omega)|^2}{S_x(\omega)S_y(\omega)}, \quad -\pi \leq \omega \leq \pi. \quad (2)$$

Certain properties of $|\gamma_{xy}(\omega)|^2$ are readily derived, e.g., $$0 \leq |\gamma_{xy}(\omega)|^2 \leq 1, \quad (3)$$

and $$|\gamma_{xy}(\omega)|^2 = 0 \quad (4)$$

if x(k) and y(k) are uncorrelated. Furthermore, $$|\gamma_{xy}(\omega)|^2 = 1 \qquad (5)$$

if $y(k) = L\{x(k)\}$, where the symbol $L\{.\}$ denotes a linear operator.

There is current interest in using $|\gamma_{xy}(\omega)|^2$ as a detection statistic for detecting the presence of common narrowband components in the time series x(k) and y(k), which, for example, may represent the outputs from two widely separated sensors. To do this, one must compute an estimate $|\hat{\gamma}_{xy}(\omega)|^2$ of the true magnitude-squared coherence, which may be obtained by analogy with Equation 2 as:

$$|\hat{\gamma}_{xy}(\omega_j)|^2 = \frac{|\hat{S}_{xy}(\omega_j)|^2}{\hat{S}_x(\omega_j)\hat{S}_y(\omega_j)}, \quad j = 0, 1, \ldots, K - 1, \qquad (6)$$

where the $\omega_j$ are a discrete set of frequencies within the interval $[0,\pi]$. In a realistic situation, this estimate is complicated by the fact that the common narrowband components in x(k) and y(k) are generally timeshifted and Doppler-compressed with respect to each other. Thus, the estimate in Eq. (6) must be computed for each grid point in a two-dimensional plane of time-delay and Doppler-shift values.

At least four algorithms may be used for the purpose of this invention. All four are Doppler compensated-cross-correlators for quadrature-sampled signals. The only significant differences are the ways in which the Doppler compensation is achieved.

The ENSCO wideband algorithm uses interpolation to modify the sampling rate on one channel. The Doppler-compensated data are then correlated by use of a fast Fourier transform (FFT) correlation algorithm. The periodicity of the FFT algorithm is removed by using a 50% zero-fill on one channel. The only approximation used is in the interpolation. The incremental time-delay correction for Doppler shift does not compensate for the rotation of carrier phase, so a carrier phase correction is also applied.

A narrowband algorithm which may be used is a coherent algorithm based on the Doppler compensation technique developed by IBM for an incoherent multi-array processor. In the coherent form, an FFT is taken of each channel for the entire accumulation time T. The Doppler compensation is provided by shifting bins of one channel before taking the product and inverse transform. Since it assumes that each bin is to be shifted by the same amount across the processing band, it is also limited. This limitation can be eliminated by interpolating between bins on one channel.

The wide-narrow, or Maloney-Trueblood algorithm is a variation of the Naval Undersea Center (NUC) narrowband algorithm, described in great detail hereinbelow. It has been shown that a numerically equivalent estimate of coherence is obtained if the two channels used do not have the same bandwidth. provided that: (1) the sampling rate required for the wider channel is used for both channels, and (2) the normalization uses only the power in the wider channel which falls within the band of the narrower channel. Although this approach appears less numerically efficient than the narrowband algorithms, it significantly reduces data shuffling, which usually represents more of the computer load than the numerical calculations.

The Naval Undersea Center (NUC) narrowband, or Trueblood, algorithm performs the Doppler compensation by multiplying the signal in one channel by a rotating phase which creates a small frequency shift. Correlation is then performed by using a time domain correlation. The frequency shift and correlation for each delay step are frequently implemented with an FFT. A block diagram of a Trueblood implementation 10 is shown in FIG. 1. Since the Doppler compression is represented as a frequency shift, the compensation is not perfect across the analysis band. It has been shown that the degradation is not serious if:

$$\tau B\alpha < 0.25$$

where $\tau$ is integration time, B is the smaller of the analysis and the signal bandwidths, and $\alpha$ is the Doppler compression factor.

The detection threshold is inversely proportional to the time-bandwidth (TB), so that the NUC narrowband algorithm is not useful for low-level, high-Doppler signals.

Another algorithm, the NUC broadband algorithm was devised to overcome this limitation by using very small analysis bands, regardless of signal bandwidth, calculating the Doppler compensated cross spectra in each band, and coherently recombining the narrow bands with an inverse transform to obtain the cross correlation for the entire signal bandwidth. Weights can be used in the inverse transform to improve performance.

Referring again to the embodiment 10 shown in FIG. 1, the Trueblood algorithm, the input series x(k) and y(k) are transformed via the fast Fourier transform (FFT), to produce successive blocks of complex Fourier coefficients $F_{xk}(\omega_j)$, where k is the block number (time) and $\omega_j$ is the coefficient frequency. These successive blocks may be computed on overlapped sample records from the input series and they are usually windowed to reduce spectral leakage. The coherence statistic $|\hat{\gamma}_{xy}(\theta,p,\omega_j)|^2$ is then given by:

$$|\gamma_{xy}(\theta,p,\omega_j)|^2 = \frac{\left|\sum_{k=1}^{N} F_{xk}(\omega_j) F^*_{y,k+p}(\omega_j)\exp(i\,k\theta)\right|^2}{\sum_{k=1}^{N}|F_{xk}(\omega_j)|^2 \sum_{k=1}^{N}|F_{y,k+p}(\omega_j)|^2} \qquad (7)$$

where $\theta$ is the relative Doppler shift (radians/block at frequency $\omega_j$) and p is the relative time shift (blocks) coordinate, and * denotes the complex conjugate. It will be noted that the right-hand side of Eq. (7) is simply an estimate of the magnitude-squared coherence between x(k) and a time-delayed, frequency-shifted version of y(k), similar to Eq. (6). FIG. 1 shows a block diagram of the signal processing operations performed by this algorithm.

The parameters of the estimate in Eq. (7) are important to later considerations. In particular, the length of the sample record used in computing each Fourier coefficient basically determines the processing bandwidth for each coherence estimate. If the narrowband components being sought are stationary, then the processing bandwidth should ideally be matched to the bandwidth of these components. This is seldom the case with real data, however. For large values of N in Eq. (7), several minutes of input data may be used in calculating a single coherence value. During this time the center frequency of a narrowband component can undergo significant excursions relative to its "short-term" bandwidth. Hence, the processing bandwidth for the coherence statistic, in practice, must be considerably larger (five to 10 times) than the anticipated "short-term" signal bandwidth. The SNR within the processing bandwidth will be proportionately smaller as a result. For example, if the processing bandwidth for a particular system is 1 HZ and the signal bandwidth is 0.2 HZ, the SNR loss due to bandwidth mismatch is 7 dB. This constraint motivates our investigation of adaptive prefiltering as a means of enhancing this target SNR within the processing bandwidth.

The distribution theory of the coherence estimate (Eq. (6)) in the case of Gaussian time series was originally developed by N. R. Goodman, in his PhD dissertation, Princeton University, 1957, entitled "On the Joint Estimation of the Spectra, Cospectrum, and Quadrature Spectrum of a Two-Dimensional Stationary Gaussian Process." The principal result is the probability density function $p_{|\hat{\gamma}|^2}(x|r,n)$ of the coherence estimate conditioned on the true value of magnitude-squared coherence $|\gamma|^2 = r$ and the number of independent segments averaged in the estimate N:

$$p_{|\hat{\gamma}|^2}(x|r,N) = \quad (8)$$

$$(N-1)\left(\frac{1-rx}{1-x^2}\right)\left[\frac{(1-x)(1-\gamma)}{(1-rx)^2}\right] {}_2F_1(1-N,1-N,1;rx),$$

where $0 \leq r < 1$ and $0 \leq x \leq 1$. Here, $_2F_1$ denotes the hypergeometric function. Functions of this type are described by A. Erdelyi, W. Magnus, F. Oberhettinger, and F. G. Tricomi, in *Higher Transcendental Functions,* Volume I. New York: McGraw Hill, 1953.

A major attractive feature of the coherence estimate as a detection statistic observed from Eq. (8) is that in the no-common-signal case, i.e., $r=0$, the density of the coherence estimate depends only on N and not on any data parameters. Thus, a threshold value designating a desired false-alarm probability $\alpha$ may be determined without knowledge of the data statistics.

Using Equation 2, the true coherence $|\gamma_{xy}(\omega)|^2$ may be related to the x- and y-channel SNRs as follows. Let $$S_x(\omega) = S_{sx}(\omega) + S_{nx}(\omega), \quad (9)$$

$$S_y(\omega) = S_{sy}(\omega) + S_{ny}(\omega), \quad (10)$$

where the "s" and "n" subscripts denote the signal and noise portions of the power spectra, respectively. Then, assuming independent noises in each channel, $$|S_{xy}(\omega)|^2 = S_{sx}(\omega) S_{sy}(\omega), \quad (11)$$

and from Eq. (2):

$$|\gamma_{xy}(\omega)|^2 = \frac{S_{sx}(\omega) S_{sy}(\omega)}{[S_{sx}(\omega) + S_{nx}(\omega)][S_{sy}(\omega) + S_{ny}(\omega)]} \quad (12)$$

$$= \frac{\frac{S_{sx}(\omega)}{S_{nx}(\omega)} \cdot \frac{S_{sy}(\omega)}{S_{ny}(\omega)}}{\left[1 + \frac{S_{sx}(\omega)}{S_{nx}(\omega)}\right]\left[1 + \frac{S_{sy}(\omega)}{S_{ny}(\omega)}\right]}$$

$$= \frac{SNR_x \cdot SNR_y}{(1 + SNR_x)(1 + SNR_y)}$$

where $SNR_x$ and $SNR_y$ are the respective x- and y-channel SNRs. Using Eqs. (12) and (8) one can produce plots of detection probability $P_d$ versus SNR (in each channel) for different values of false-alarm probability $\alpha$ and N.

All of the results described herein for the pairwise coherence statistic have been extended to the multiple coherence statistic. Most importantly, the discussion of processing bandwidth considerations and the resulting constraints applies equally as well in the multiple coherence case as it does for pairwise coherence. Hence, the concept of adaptive prefiltering using the adaptive line enhancer (ALE) described hereinbelow is applicable to the multiple coherence case, even though attention is restricted herein to pairwise coherent processing.

The adaptive line enhancer is a relatively new device which provides a novel approach to the difficult problem of detecting narrowband signals with unknown parameters in broadband colored noise. For stationary, well-defined signals in noise, in theory, one can derive optimal detectors. However, this goal is generally impossible in cases where the input statistics are nonstationary and unspecified. The enhancer is an adaptive, suboptimal, device whose detection performance can be made arbitrarily close to the optimum detector for certain well-defined, stationary, cases. More importantly, the enhancer requires no a priority knowledge of input statistics and can adapt to changing input statistics.

A time-domain ALE structure 30 is shown in FIG. 2. This structure 30 is a variation of the Widrow-Hoff least-mean-square (LMS) adaptive filter. This filter is described in great detail by one of the coinventors, Bernard Widrow, "Adaptive Filters", in *Aspects of Network and System Theory,* R. E. Kalman and N. Declaris, eds New York: Holt, Rhinehart, & Winston Inc., 1971.

In FIG. 2, the input analog signal is converted by analog-to-digital converter 32 into the digital signal x(k). The signal then enters signal summer 34. The output of summer 34 is an error signal $\epsilon(k)$, at output 36.

In the lower channel, the signal x(k) is delayed, in delay line 39, by a fixed amount $\Delta$, prior to being passed through an adaptive linear transversal filter 40. The output signal r(k) of this filter 40 is subtracted from the current input signal x(k) in summer 34. Summer 34 actually takes the difference of its two input signals. The difference $\epsilon(k)$, at 36, is fed back to adjust the filter weights $w_j(k)$ according to the recursive algorithm:

$$w_j(k+1) = w_j(k) + 2\mu\epsilon(k)x'(k-j+1), j=0,1,\ldots,L-1, \quad (13)$$

where $\mu$ is a constant and $x'(k) = x(k) - \Delta$. Equation (13) is described by B. Widrow in the book by Kalman and Declaris, referenced hereinabove.

Another very useful reference which gives a broad overview of the whole field of adaptive filtering is the article by Bernard Widrow, J. R. Glover, Jr., J. M. McCool, J. Kaunitz, C. S. Williams, R. H. Hearn, J. R. Zeidler, E. Dong, Jr. and R. C. Goodline, entitled "Adaptive Noise Cancelling: Principles and Applications", which appeared in the Proceedings of IEEE, Volume 63, pp. 1692-1716, Dec. 1975.

The principle of operation is described in great detail in the Zeidler and Chabries reference mentioned hereinabove. In brief, the principle of operation is as follows. The weight algorithm in Eq. (13) adjust the weights in the transversal filter 40 so as to minimize the mean power in $\epsilon(k)$. The delay $\Delta$ is chosen so that any broadband power in the delayed signal $x'(k)$ is essentially decorrelated with the current input $x(k)$, while any corresponding narrowband power remains highly correlated. Thus, $\Delta$ should be somewhere within the range of $\tau_b << \Delta < \tau_n$, where $\tau_b$ and $\tau_n$ are the correlation time constants of the broadband and narrowband input components, respectively. The implicit strategy of using the algorithm for the filter 40 then is to make $r(k)$ a prediction of the current narrowband waveform value $x(k)$; thus, when $r(k)$ is subtracted from $x(k)$, the mean power in $\epsilon(k)$ is diminished. Then the filter weights will tend to form a bandpass transfer function about any narrowband input frequencies and will pass relatively little power at other frequencies. Details of this effect for the case of multiple sinusoids in white noise is described by J. R. Zeidler, E. H. Satorius, D. M. Chabries, and H. T. Wexler, in the article entitled "Adaptive Enhancement of Multiple Sinusoids in Uncorrelated Noise", which appeared in IEEE Transactions of Acoustics, Speech and Signal Processing, 1978.

For stationary, uncorrelated, input samples it has been shown by B. Widrow, in his report entitled "Adaptive Filters" that the expected value, of $w_j(k)$ in Eq. (13) converges, from an arbitrary initial value, to the solution of the Wiener-Hopf matrix equation:

$$\Phi w = d, \tag{14}$$

where $\Phi$ and d are the $L \times L$ autocorrelation matrix and $L \times 1$ cross-correlation vector, respectively, with elements:

$$\Phi_{ij} = \Phi_{xx}(i-j) \text{ and } d_j = \Phi_{xx}(j + \delta - 1), \tag{15}$$

provided that $0 < \mu < \lambda \max^{-1}$. Here, $\Phi_{xx}(m)$ is the autocorrelation function of the input $x(k)$ and $\lambda_{max}$ is the largest eigenvalue of the matrix $\Phi$. The covariance matrix of the weights can be shown to be proportional to $\mu$ and thus can be made arbitrarily small by decreasing $\mu$. This is shown in the article "Adaptive Noise Cancelling: Principles and Applications", referenced hereinabove. Hence, for proper choice of the delay $\Delta$, the ALE output approaches the minimum mean-squared error estimate of the current narrowband waveform in the input. Other results and convergent properties of the adaptive line enhancer for stationary, correlated input data are discussed by J. R. Treichler, in the article entitled "The Spectral Line Enhancer - the Concept, an Implementation, and an Application", in his PhD dissertation, Stanford University, June 1977.

The theoretical discussion hereinabove applies to the embodiments shown in the FIG. 2 of a time-domain adaptive line enhancer 30, and of a frequency-domain line enhancer 50 shown in FIG. 3.

An adaptive correlator comprising only two signal channels is described in the Abstract of the Disclosure. The various embodiments of the invention, utilizing a plurality of N signal channels, will now be described, beginning with the basic adaptive correlator 60 shown in FIG. 4. The adaptive correlator 60 comprises a plurality of N adaptive linear predictive (ALE) means for filtering, 64-1 to 64-N, for receiving N input signals, in N channels, 62-1 through 62-N, and adaptively filtering them.

A means 65, whose N inputs are connected to the outputs of the N adaptive filtering means, 64-1 through 64-N, correlates its input signals.

FIG. 5 shows the second embodiment of the adaptive correlator 80. It comprises the plurality of N ALE filters, 86-1 through 86-N and the correlator 96, similar to the corresponding elements shown in FIG. 4, but, in addition it has N other elements. These elements comprise a plurality of N fast Fourier transform (FFT) devices, 84-1 through 84-N. The N FFT devices, 84-1 through 84-N receive the N input signals, at inputs 82-1 through 82-N, respectively, and transform them.

FIG. 6 illustrates a third embodiment 100 of the invention. In this embodiment 100 the positions of the N ALP filters, 104-1 through 104-N, and the N FFT devices, 106-1 through 106-N are interchanged with respect to their positions in the embodiment 80 shown in FIG. 5.

Obviously, many modifications and variations of the present invention are possible in the light of the above teachings. It is therefore to be understood that within the scope of the appended claims the invention may be practiced otherwise than as specifically described.

What is claimed is:

1. An adaptive correlator for correlating a plurality of N input signals, each signal traversing its own channel, comprising:
   a plurality of N adaptive linear predictive (ALP) means for filtering, each having an input and an output, for receiving the input signals in their respective channels and adaptively filtering them; and
   means having N inputs which are connected to the outputs of the N adaptive filtering means, for correlating its N input signals.

2. The adaptive correlator according to claim 1, further comprising:
   a plurality of N fast Fourier transform (FFT) devices, each having an input and an output, for receiving and transforming their input signals, the outputs of the N FFT devices being connected to the inputs of the N ALP filters.

3. An adaptive correlator for correlating a plurality of N input signals, each signal traversing its own channel, comprising:
   a plurality of N adaptive linear predictive (ALP) means for filtering, each having an input and an output, for receiving the input signals in their respective channels and adaptively filtering them;
   a plurality of N FFT devices, each having an input and an output, whose inputs are connected to the outputs of the N ALP filters; and
   means having N inputs which are connected to the outputs of the N FFT devices, for correlating its N input signals.

* * * * *